United States Patent
Allman et al.

(10) Patent No.: US 6,583,026 B1
(45) Date of Patent: Jun. 24, 2003

(54) PROCESS FOR FORMING A LOW K CARBON-DOPED SILICON OXIDE DIELECTRIC MATERIAL ON AN INTEGRATED CIRCUIT STRUCTURE

(75) Inventors: Derryl D. J. Allman, Camas, WA (US); Ponce Saopraseuth, Gresham, OR (US); Hemanshu D. Bhatt, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 41 days.

(21) Appl. No.: 09/872,058

(22) Filed: May 31, 2001

(51) Int. Cl.$^7$ ................................................. H01L 21/76
(52) U.S. Cl. ........................ 438/424; 438/723; 438/763; 438/798
(58) Field of Search ................................. 438/424, 798, 438/723, 763

(56) References Cited

U.S. PATENT DOCUMENTS

| | | | |
|---|---|---|---|
| 3,012,861 A | 12/1961 | Ling | ........................ 23/223.5 |
| 3,178,392 A | 4/1965 | Kriner | ........................ 260/46.5 |
| 3,652,331 A | 3/1972 | Yamazaki | ................... 117/201 |

(List continued on next page.)

FOREIGN PATENT DOCUMENTS

| | | | | |
|---|---|---|---|---|
| DE | 198 04 375 A1 | 7/1999 | ......... | H01L/21/312 |
| EP | 0 706 216 A2 | 4/1996 | ......... | H01L/23/532 |
| EP | 0 949 663 A2 | 10/1999 | ......... | H01L/21/312 |
| JP | 63003437 | 1/1988 | ........... | H01L/21/90 |
| JP | 2000-267128 | 9/2000 | ........... | G02F/1/136 |
| WO | WO99/41423 | 8/1999 | | |

OTHER PUBLICATIONS

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

(List continued on next page.)

*Primary Examiner*—Vu A. Le
*Assistant Examiner*—Pho M. Luu
(74) *Attorney, Agent, or Firm*—John P. Taylor

(57) ABSTRACT

A process for forming a low k carbon-doped silicon oxide dielectric material (lkc-dsodm) on an integrated circuit structure is characterized by improved planarity and good gap fill in high aspect ratio regions of the integrated circuit structure, as well as improved film strength and adherence, and less byproducts trapped in the film. The process comprises: depositing a plurality of layers of lkc-dsodm on an integrated circuit structure in a reactor; and pausing after depositing each layer of lkc-dsodm and before depositing a further layer of lkc-dsodm. The process can further include first forming a base or barrier layer of a silicon-rich and nitrogen-rich dielectric material over the integrated circuit structure, plasma etching the upper surface of the barrier layer to facilitate adhesion of the subsequently deposited lkc-dsodm to the barrier layer, and then, before depositing the first layer of lkc-dsodm, cooling the etched barrier layer down to within 10° C. or less of the subsequent deposition temperature used for formation of the film of lkc-dsodm. In another aspect of the invention the pausing step further includes, before deposition of the next layer of lkc-dsodm, flowing a source of non-reactive gas over the surface of the newly deposited layer of lkc-dsodm to facilitate outgassing and removal of byproducts resulting from the preceding formation and deposition of lkc-dsodm.

23 Claims, 2 Drawing Sheets

U.S. PATENT DOCUMENTS

| | | | |
|---|---|---|---|
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau | |
| 6,063,702 A | 5/2000 | Chung | |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,346,488 B1 * | 2/2002 | Kabansky | 438/783 |
| 6,346,490 B1 * | 2/2002 | Catabay et al. | 438/795 |
| 6,350,700 B1 * | 2/2002 | Schinella et al. | 438/723 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Bothra, S., et al., "Integration of 0.25μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dieletric", *Semiconductor International*, vol. 21, No. 10, Sep., 1998, pp. 64–66, 68, 70, 72, and 74.

* cited by examiner

```
┌─────────────────────────────────────────┐
│   DEPOSITING A LAYER OF LOW K DIELECTRIC │
│     MATERIAL OVER A BARRIER LAYER OF    │
│      DIELECTRIC MATERIAL FORMED ON      │
│       AN INTEGRATED CIRCUIT STRUCTURE   │
└─────────────────────────────────────────┘
                    │
┌─────────────────────────────────────────┐
│   PAUSING DEPOSITION OF LOW K DIELECTRIC │
│                MATERIAL                  │
└─────────────────────────────────────────┘
                    │
┌─────────────────────────────────────────┐
│  FLOWING NON-REACTIVE GAS OVER SURFACE  │
│    OF NEWLY DEPOSITED LOW K DIELECTRIC  │
│       MATERIAL DURING PAUSING STEP      │
└─────────────────────────────────────────┘
                    │
┌─────────────────────────────────────────┐
│    REPEATING STEPS OF DEPOSITING AND    │
│  PAUSING UNTIL DESIRED THICKNESS OF LOW K│
│       DIELECTRIC MATERIAL IS REACHED    │
└─────────────────────────────────────────┘
```

FIGURE 1

PROCESS FOR FORMING A LOW K CARBON-DOPED SILICON OXIDE DIELECTRIC MATERIAL ON AN INTEGRATED CIRCUIT STRUCTURE

CROSS-REFERENCE TO RELATED APPLICATION

The subject matter of this application relates to the subject matter of copending U.S. patent application docket No. 09/873,043 entitled "PROCESS FOR REMOVAL OF RESIST MASK OVER LOW K CARBON-DOPED SILICON OXIDE DIELECTRIC MATERIAL OF AN INTEGRATED CIRCUIT STRUCTURE, AND REMOVAL OF RESIDUES FROM VIA ETCH AND RESIST MASK REMOVAL", assigned to the assignee of this application, and filed on the same date as this application.

BACKGROUND OF THE INVENTION

1. Field of the Invention

This invention related to an integrated circuit structure. More particularly this invention relates to a process for forming a carbon-doped low k silicon oxide dielectric material on an integrated circuit structure.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21 No. 10, September 1998, at pages 64–74, a number of such alternate dielectric materials are disclosed and discussed. Included in these dielectric materials is a description of a low k carbon-doped silicon oxide dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The use of low k carbon-doped silicon oxide dielectric material formed by reacting methyl silane with hydrogen peroxide (the Trikon process) has been found to be capable of better gap filling characteristics than other low k materials. Good gap filling characteristics, in turn, can result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, it has been found that the formation of such low k carbon-doped silicon oxide dielectric materials by the Trikon process does not always result in complete filling of the gaps between, for example, closely spaced apart raised metal lines, and does not always adhere well to the underlying materials. Such materials are also sometimes found to have byproducts of the reaction trapped in the film. It would, therefore, be desirable to optimize the process to provide for a more reliable formation of a film of low k carbon-doped silicon oxide dielectric material possessing good gap filling characteristics, good adherence to underlying materials resulting in improved film strength, and having less byproducts trapped in the film.

SUMMARY OF THE INVENTION

The invention comprises an improved process for forming a low k carbon-doped silicon oxide dielectric material on an integrated circuit structure characterized by improved planarity and good gap fill in high aspect ratio regions of the integrated circuit structure, as well as improved film strength and adherence, and less byproducts trapped in the film. The process comprises: depositing a plurality of layers of low k carbon-doped silicon oxide dielectric material on an integrated circuit structure in a reactor; and pausing after depositing each layer of low k carbon-doped silicon oxide dielectric material and before depositing a further layer of low k carbon-doped silicon oxide dielectric material.

In one aspect the process further includes first forming a base or barrier layer of a silicon-rich and nitrogen-rich dielectric material over the integrated circuit structure, plasma etching the upper surface of the barrier layer to facilitate adhesion of the subsequently deposited low k carbon-doped silicon oxide dielectric material to the barrier layer, and then, before depositing the first layer of low k carbon-doped silicon oxide dielectric material, cooling the etched barrier layer down to within 10° C. or less of the subsequent deposition temperature used for formation of the film of low k carbon-doped silicon oxide dielectric material.

In another aspect of the invention the pausing step further includes, before deposition of the next layer of low k carbon-doped silicon oxide dielectric material, flowing a source of non-reactive gas over the surface of the newly deposited layer of low k carbon-doped silicon oxide dielectric material to facilitate outgassing and removal of byproducts resulting from the preceding formation and deposition of the newly formed layer of low k carbon-doped silicon oxide dielectric material.

BRIEF DESCRIPTION OF THE DRAWINGS

FIG. 1 is a flow sheet illustrating one embodiment of the invention.

DETAILED DESCRIPTION OF THE INVENTION

Figure 2:
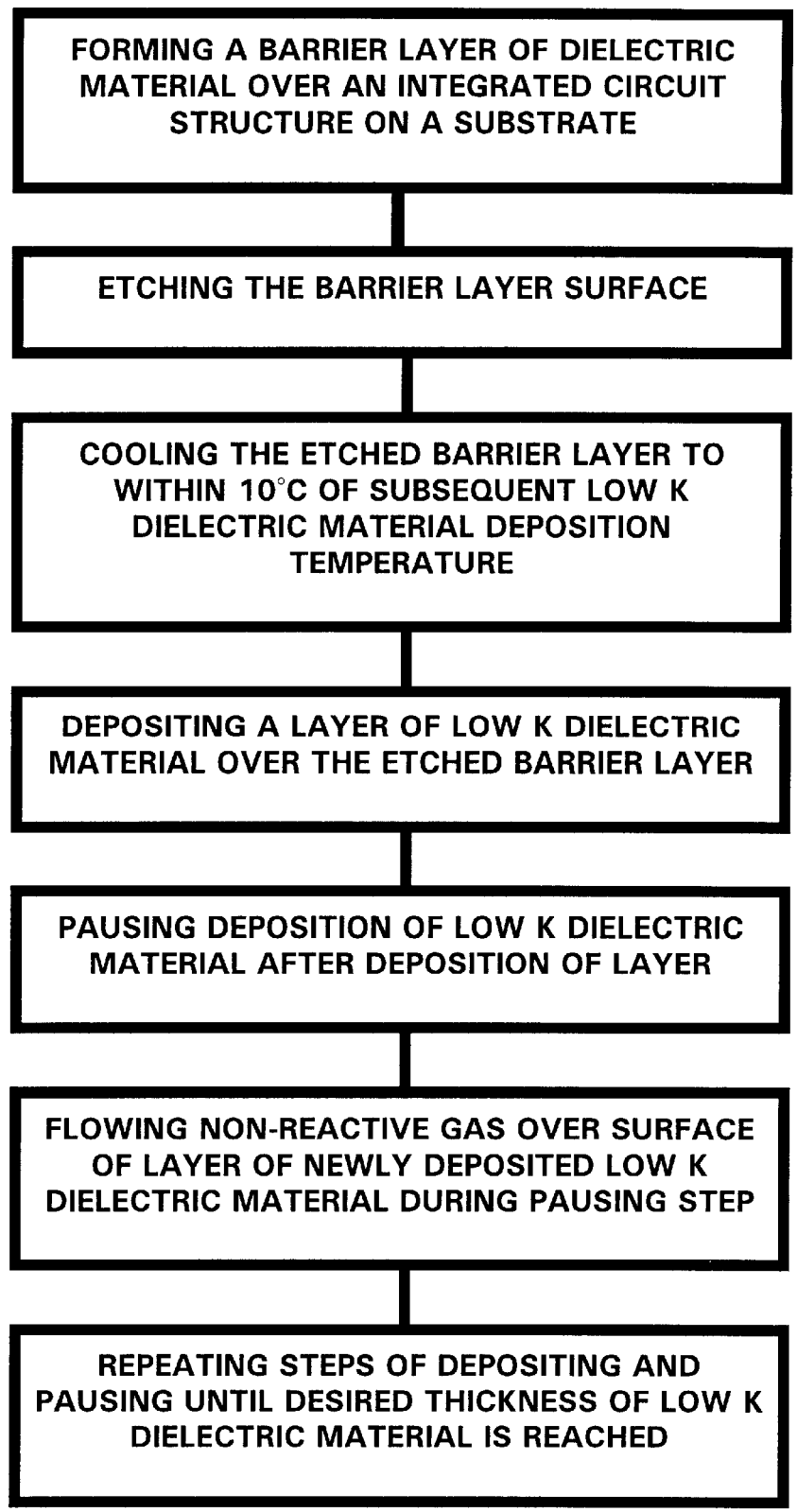
FIG. 2 is a flow sheet illustrating another embodiment of the invention.

The invention comprises an improved process for forming a low k carbon-doped silicon oxide dielectric material on an integrated circuit structure formed on a substrate such as a semiconductor wafer, e.g., a single crystal silicon semiconductor wafer. The low k carbon-doped silicon oxide dielectric material formed by the process of the invention is characterized by improved planarity and good gap fill in high aspect ratio regions of the integrated circuit structure, as well as improved film strength and adherence, and less byproducts trapped in the film. The process of the invention comprises: depositing a plurality of layers of low k carbon-doped silicon oxide dielectric material on an integrated circuit structure in a reactor; and pausing after depositing each layer of low k carbon-doped silicon oxide dielectric material and before depositing a further layer of low k carbon-doped silicon oxide dielectric material.

In one embodiment, the process further includes first forming a base or barrier layer of a silicon-rich and nitrogen-rich dielectric material over the integrated circuit structure, plasma etching the upper surface of the barrier layer to facilitate adhesion of the subsequently deposited low k carbon-doped silicon oxide dielectric material to the barrier layer, and cooling the substrate with the barrier layer thereon down to within 10° C. or less of the subsequent deposition temperature used for formation of the low k carbon-doped silicon oxide dielectric material.

In another embodiment of the invention the pausing step further includes, before deposition of the next layer of low k carbon-doped silicon oxide dielectric material, flowing a source of non-reactive gas over the surface of the newly deposited layer of low k carbon-doped silicon oxide dielectric material to facilitate outgassing and removal of byproducts resulting from the formation and deposition of the newly formed layer of low k carbon-doped silicon oxide dielectric material.

By use of the interchangeable terms "low k" or "low dielectric constant" herein is meant a dielectric constant below the dielectric constant of silicon oxide or silicon nitride. Preferably, a low dielectric constant is a dielectric constant below about 3.5, and more preferably below about 3.

The pausing step carried out between the respective depositions of low k carbon-doped silicon oxide dielectric material may, in its simplest form, merely comprise a brief cessation of the deposition and reaction carried out by interrupting the flow of the reactants into the chamber. However, while we do not wish to be bound by any theories as to the function of this pausing step, it is believed that the pausing step may further permit a curing or reaction completion of the already deposited materials comprising the first layer of low k carbon-doped silicon oxide dielectric material, as well as to allow the deposited film to planarize by surface tension energy reduction. The pausing step is also believed to help control the reaction temperature during the respective reaction/deposition steps since the reaction to form the low k carbon-doped silicon oxide dielectric material is exothermic. Further it is believed that the pausing step permits outgassing and byproduct evaporation which, particularly when the flow of non-reactive gas is provided during the pausing step as described above, can be removed from the reaction chamber or at least removed from the surface of the layer of low k carbon-doped silicon oxide dielectric material prior to commencement of the next reaction/deposition step to form the subsequent layer of low k carbon-doped silicon oxide dielectric material. Thus, while the pausing step may comprise a mere passive stopping of the deposition, the use of the term is intended to include other possible functions as well.

The low k carbon-doped silicon oxide dielectric material formed by the process of the invention is deposited on an integrated circuit structure formed on a substrate such as a semiconductor wafer, e.g., a single crystal silicon semiconductor wafer. The low k carbon-doped silicon oxide dielectric material formed by the process of the invention may be deposited over the active devices of the integrated circuit structure and beneath the first layer of electrically conductive interconnects, with contact openings formed through the low k carbon-doped silicon oxide dielectric material and then filled with electrically conductive material to electrically connect, for example, the contacts on the active devices such as source, drain, and gate contacts, with an overlying electrically conductive interconnect layer.

Alternatively or additionally, the low k carbon-doped silicon oxide dielectric material formed by the process of the invention may be deposited between electrically conductive interconnect layers such as between upper and lower metal interconnect layers or between a local interconnect layer and the first metal interconnect layer of the integrated circuit structure. The process of the invention finds particular utility when used to form low k carbon-doped silicon oxide dielectric material capable of flowing into the gaps between closely spaced apart raised conductive material such as closely spaced apart metal lines having high aspect ratio spaces therebetween. Such closely spaced apart metal lines are capable of developing undesired horizontal capacitance between adjoining metal lines, thereby making the formation and deposition of low k carbon-doped silicon oxide dielectric material between such closely spaced apart metal lines both desirable yet difficult to achieve using conventional deposition techniques.

In a preferred embodiment, the low k carbon-doped silicon oxide dielectric material formed by the process of the invention is deposited onto a conformal base or barrier layer of dielectric material which is first deposited over the integrated circuit structure to provide a barrier between the low k carbon-doped silicon oxide dielectric material and underlying portions of the integrated circuit structure to prevent any chemical interaction between the low k carbon-doped silicon oxide dielectric material and other materials in the underlying integrated circuit structure. The barrier or base layer is preferably a silicon-based dielectric material such as silicon oxide, silicon oxynitride, or silicon nitride. It is particularly preferred that the dielectric material be a silicon-rich and nitrogen-rich dielectric material having from about 5 to about 10 atomic % of nitrogen therein and most preferably about 7 atomic % nitrogen; and having from about 3 to about 5 atomic %, of silicon and typically about 4 atomic %, silicon in excess of the stoichiometric amount of silicon in the dielectric material. The base or barrier layer of dielectric material may be deposited in any convenient manner, such as by a CVD deposition using a mixture of $O_2$ and $O_3$ as the oxidizing agent with either silane ($SiH_4$) or tetraethylorthosilicate (TEOS) as the source of silicon, with either nitrogen gas added to the reactants to provide the preferred nitrogen content, or the barrier layer subsequently treated with nitrogen, e.g., exposure to a nitrogen plasma. Most preferably, the silicon-rich and nitrogen-rich barrier layer of dielectric material is formed by a plasma enhanced chemical vapor deposition (PECVD) process using nitrous oxide ($N_2O$), silane ($SiH_4$), and oxygen ($O_2$), with the reaction parameters adjusted to provide a silicon-rich and nitrogen-rich barrier layer having an excess of about 4 atomic % nitrogen and about 4 atomic % silicon over stoichiometric amounts of each.

The barrier layer is deposited over the integrated circuit structure to a thickness which may range from as little as about 10 nanometers (nm) to as much as about 300 nm. Less than about 10 nm of thickness may not provide sufficient thickness to provide the desired barrier between the underlying integrated circuit structure and the low k carbon-doped silicon oxide dielectric material to be formed over the barrier layer, while more than about 300 nm in thickness is unnecessary to achieve the desired barrier and may only needlessly add to the thickness of the structure. Preferably the thickness of the barrier layer will range from about 30 nm to about 100 nm, and typically will be about 50 nm, After formation of the barrier layer over the underlying integrated circuit, in accordance with a preferred embodiment of the process of the invention, the upper surface of the barrier layer is roughened to enhance bonding between the barrier layer surface and the low k carbon-doped silicon oxide dielectric material to be formed thereon. This roughening of the barrier layer surface may be carried out by exposing the surface of the barrier layer to an oxygen plasma. The semiconductor wafer, having the barrier layer formed over the integrated circuit structure thereon, is placed in an etching chamber into which oxygen gas is then flowed at a flow rate equivalent to flowing oxygen into a 0.5 liter chamber at a flow rate of from about 1000 standard cubic centimeters per minute (sccm) to about 2000 sccm while maintaining a pressure in the etching chamber of from about 400 millitorr (mt) to about 1400 mt. A plasma is ignited in the chamber and then maintained at a power level ranging from about 100 watts to about 500 watts for a period of from about 30 seconds (sec) to about 60 sec.

Following the roughening of the surface of the barrier layer, the barrier layer is then cooled down to within about 10° C., preferably within about 5° C. of the temperature at which the low k carbon-doped silicon oxide dielectric material will be formed and deposited, and most preferably down to the deposition temperature. While we do not wish to be bound by any theories of operation, it is believed that this step of cooling the etched wafer (which may reach a temperature as high as 350° C. during the etching step) prior to deposition of the low k carbon-doped silicon oxide dielectric material may inhibit premature reaction and curing of the low k carbon-doped silicon oxide dielectric material before it flows into the high aspect ratio regions between closely spaced apart geometries on the integrated circuit structures such as closely spaced apart metal lines. The cooling of the substrate with the etched barrier layer thereon may be carried out in any convenient manner such as by letting the wafer stand for a sufficient period of time in the etching chamber after the plasma has been extinguished, or by the use of a wafer support platform in the etching chamber having cooling coils therein, or by moving the etched wafer to a cooling apparatus. Preferably the etched barrier layer on the substrate is cooled by transferring the substrate to a cooling platform and cooling the substrate by conduction down to a temperature of ~10° C. prior to transferring the substrate into the low k deposition chamber.

After forming the barrier layer of dielectric material, etching the surface of the barrier layer, and then cooling the substrate with the etched barrier layer thereon to remove the heat generated during the etching step, the first layer of low k carbon-doped silicon oxide dielectric material may be formed over the etched surface of the barrier layer.

To obtain the desired filling of high aspect ratio volumes between closely spaced apart members such as raised metal lines, a mild oxidizing agent such as a peroxide should be used as the source of oxygen for the low k carbon-doped silicon oxide dielectric material to be formed and deposited on the barrier layer surface. The other reactant, which will provide the source of silicon as well as the source of the material which will result in the formation of a silicon oxide-based dielectric material having a low dielectric constant (k), may comprise methyl silane ($CH_3SiH_3$), as described in the previously referenced Peters and McClatchie et al. articles. This reactant may also comprise a multiple carbon-substituted silane such as described in U.S. Pat. No. 6,303,047, issued Oct. 16, 2001, and assigned to the assignee of this invention, the subject matter of which is hereby is incorporated by reference. Also capable of being used as the source of silicon and the additives which serve to lower the dielectric constant of the resulting dielectric material are organofluoro silanes such as described in U.S. Pat. No. 6,365,528, issued Apr. 2 2002, and in Ser. Nos. 09/792,683, 09/792,685, and 09/792,691; all filed on Feb. 23, 2001. All four of these applications are assigned to the assignee of this application, and the subject matter of all four applications is hereby incorporated by reference. If desired the substituted silane may be blended with other additives to achieve certain properties. For example, the substituted silane may be mixed with unsubstituted silane ($SiH_4$), if desired.

To form the desired film of low k carbon-doped silicon oxide dielectric material thereon, the semiconductor substrate having the barrier layer formed thereon is mounted on a cooled substrate support in a CVD chamber into which the mild oxidizing agent and the substituted silane reactants are introduced in vaporous form. Both the substituted silane (and silane itself when used) and the mild oxidizing agent, e.g., hydrogen peroxide are introduced into the chamber in a gaseous or vaporous phase. The delivery system for the reactants is preferably maintained at a temperature which ensures delivery of the reactants into the chamber as gases or vapors, typically from about 70° C. to about 100° C.

During the reaction and deposition, the temperature of the substrate support in the reaction chamber is maintained at a low deposition temperature ranging from about 0° C. to about 30° C., preferably ranging from 4° C. to about 25° C., and most preferably from about 4° C. to about 15° C. Typically the deposition temperature will be maintained at about 10° C.

During the deposition, the reaction chamber is advantageously maintained at a pressure of from above about 300 millitorr to about 1500 millitorr, preferably from about 400 millitorr to about 900 millitorr, and most preferably from about 600 millitorr to about 800 millitorr, with the typical pressure maintained at about 600 millitorr.

Flow rates of the individual reactants will depend upon chamber size and will also vary with the particular reactants. Thus, the flow rates of the respective reactants into the reactor chamber maintained within the above pressure and temperature ranges will be equivalent to flow rates into a 0.5 liter reactor of from about 0.5 grams/minute to about 1.8 grams per minute of the mild oxidizing agent (when the mild oxidizing agent is ~60 vol. % $H_2O_2$ in water); from about 70 standard cubic centimeters per minute (sccm) to about 120 sccm, and preferably from about 85 sccm to about 105 sccm of methylsilane; and from 0 to about 40 sccm, preferably from about 10 sccm to about 40 sccm of silane.

Maintaining the deposition at such a low pressure (i.e. 1500 millitorr or less) coupled with the flow rates recited above results in reduced nucleation deposition rate. The low pressure will reduce the deposition rate which maximizes the surface mobility and is a better wetting process.

The reaction is carried out for a period of time sufficient to deposit a layer of low k carbon-doped silicon oxide dielectric material over the surface of the integrated circuit structure having a thickness of ranging from about 10 nm to about 400 nm, and preferably ranging from about 100 nm to about 300 nm, with the typical thickness of each layer of low k carbon-doped silicon oxide dielectric material comprising about 200 nm. When the deposition/reaction is carried out within the temperature and pressure ranges and flow rates given above, the deposition rate will range from about 300 nm/minute to about 700 nm/minute, and typically will be about 600 nm/minute, resulting in a deposition time of at least about 5 seconds, and preferably ranging from about 20 seconds to about 90 seconds, with the typical deposition time comprising about 20 seconds.

After formation of the layer of low k carbon-doped silicon oxide dielectric material to a thickness within the range discussed above, in accordance with one aspect of the invention the flow of reactive gases into the reaction chamber is shut off to thereby provide a pause in the deposition. As previously discussed above, in its simplest form, this pause may merely comprise a brief cessation of the deposition and reaction. However, this pausing step may further permit a further curing or reaction completion of the already deposited materials, using a heated showerhead (~100° C.) and a reduced pressure to comprise the first layer of low k carbon-doped silicon oxide dielectric material, as well as to allow the deposited film to planarize by surface tension energy reduction. The pausing step may also help control the reaction temperature during the respective reaction/deposition steps since the reaction to form the low k carbon-doped silicon oxide dielectric material is exothermic. The pausing step also permits outgassing and byproduct evaporation. When a flow of non-reactive gas is provided during the pausing step, as will be described below, such gases and byproducts can be removed from the reaction chamber or at least removed from the surface of the layer of low k carbon-doped silicon oxide dielectric material prior to commencement of the next reaction/deposition step to form the subsequent layer of low k carbon-doped silicon oxide dielectric material.

In accordance with the invention, the pause in the deposition of low k carbon-doped silicon oxide dielectric material is carried out for a minimum time period of at least about 10 seconds, and preferably at least about 15 seconds up to about 90 seconds, with a pause of about 30 seconds being typical. Longer periods of time can be used between deposition steps but are believed to be unnecessary and therefore not economical. Preferably, the previously described deposition temperature is maintained during the pausing step.

In a preferred embodiment, during the pausing step, a flow of one or more non-reactive gases is flowed over the surface of the newly deposited layer of low k carbon-doped silicon oxide dielectric material. Such non-reactive gases may include nitrogen, helium, argon, and neon. The flow rate of such one or more non-reactive gases over the surface of the newly deposited layer of low k carbon-doped silicon oxide dielectric material will be equivalent to flow rates into a 0.5 liter reactor of from about 6 liters/minute to abut 12 liters/minute, and typically will be about 9 liters/minute for a period of at least 15 seconds. Such a flow of non-reactive gas over the surface of the newly deposited layer of low k carbon-doped silicon oxide dielectric material will serve to assist in lowering the surface tension and remove byproducts from the surface of the newly formed low k dielectric layer during the deposition pause.

After the pause step has been carried out, the deposition of a further layer of low k carbon-doped silicon oxide dielectric material is begun by resuming the flow of the reactant gases into the chamber. These steps of deposition and pausing are repeated until the composite layer of low k carbon-doped silicon oxide dielectric material attains the desired thickness. Usually this thickness will range from a minimum of about 200 nm up to about 1800 nm, preferably from about 1200 nm to about 1400 nm, and typically about 1300 nm, to ensure sufficient electrical insulation between underlying conductive regions and conductive regions to be formed over the low k carbon-doped silicon oxide dielectric material. Thicker layers can be formed, but are deemed unnecessary and merely add to the bulk of the structure.

After forming the low k carbon-doped silicon oxide dielectric material to the desired thickness in accordance with the just described process of the invention, the resulting film of low k carbon-doped silicon oxide dielectric material may be further processed, for example, by transporting the semiconductor substrate, having the newly deposited film of low k carbon-doped silicon oxide dielectric material thereon, in a vacuum to a heat treatment chamber to cure the film of low k carbon-doped silicon oxide dielectric material thereon. In this chamber the substrate is placed on a surface heated to at least about 275° C. and not exceeding about 525° C. The pressure of the chamber can be dynamically pumped using an input flow of nitrogen to control the pressure. The cure of the film may be ramped by slowly lowering the substrate to the surface of the hot plate in the heat treatment chamber. The slow ramp will allow for a slower evolution of byproducts while the network of the film is forming. This will allow for less shrinkage in the film of low k carbon-doped silicon oxide dielectric material. The curing time should be at least about 5 minutes.

Following the cure of the film of low k carbon-doped silicon oxide dielectric material, the substrate may be transported in a vacuum to a plasma enhanced chemical vapor deposition chamber where the film is etched, using an oxygen plasma to roughen the surface of the film and remove carbon from the top layer so that the adherence of subsequent deposited oxide material to the film can be improved. The oxygen plasma may etch 50 Å to 1000 Å, preferably 100 Å, from the surface of the film of low k carbon-doped silicon oxide dielectric material.

Following the etch step, an oxide-capping layer may be formed over the newly etched surface of the film of low k carbon-doped silicon oxide dielectric material to prevent the diffusion of water back into the film during transport to subsequent processing steps. The stress of this oxide capping film or layer should be compressive to prevent the subsequent failure of the film of low k carbon-doped silicon oxide dielectric material due to cracking. If a capping layer is not used for films having a thickness exceeding about 1000 nm, the film of low k carbon-doped silicon oxide dielectric material may crack during subsequent processing steps. The thickness of the oxide capping layer can range from less than 100 nm to 3000 nm, and typically will be about 300 nm.

Following the in situ capping layer deposition, another silicon dioxide layer may be deposited over the oxide capping layer to serve as a chemical mechanical polish (CMP) layer to provide a planarized surface thereon to facilitate subsequent photolithography used to form a via etch mask of resist material over the layer of low k carbon-doped silicon oxide dielectric material. The thickness of this CMP layer will be dependent upon the thicknesses of the previous low k and capping layers, the step height of the topography, and the desired degree of planarity after the CMP process. This additional oxide thickness can range from about 500 nm to about 4000 nm (preferably 2700 nm of additional oxide is deposited). After the deposition of the additional oxide, the wafer is processed through a CMP process step to planarize the surface of the wafer to an oxide variance of less than 300 nm. A photoresist mask may then be formed over the planarized oxide layer and the structure may be further processed conventionally to form vias through the layer of low k carbon-doped silicon oxide dielectric material, as well as the capping layer and the barrier layer beneath the layer of low k carbon-doped silicon oxide dielectric material.

To further illustrate the process of the invention, on a silicon semiconductor wafer may be formed a 50 nm thick silicon-rich and nitrogen-rich silicon oxide barrier layer by first reacting silane ($SiH_4$), nitrous oxide ($N_2O$) and oxygen ($O_2$) by PECVD under conditions which result in deposition of the silicon-rich and nitrogen-rich silicon oxide barrier layer. The silicon oxide barrier layer is then exposed to an oxygen plasma to etch the surface of the barrier layer. The etched barrier layer is then allowed to cool to room temperature after which the wafer is moved to a CVD chamber and placed on a cooled wafer support maintained at a temperature of about 23° C. The pressure in the CVD chamber is maintained at about 500 millitorr. Hydrogen peroxide, silane, and methyl silane are then flowed into the chamber in vaporous/gaseous form until about 200 nm of low k carbon-doped silicon oxide dielectric material has deposited over the barrier layer. The flow of reactant gases is then shut off and nitrogen gas is flowed into the chamber at a rate of 9 liters/minute for about 30 seconds to remove byproducts from the surface of the newly deposited layer of low k carbon-doped silicon oxide dielectric material. The deposition and pausing steps may then be repeated five or six times to achieve a thickness of low k carbon-doped silicon oxide dielectric material sufficient to fill the small spaces between metal lines. The total low k film thickness will depend on the thickness of the metal lines and the width of the space to fill.

When the subsequently annealed composite layer of low k carbon-doped silicon oxide dielectric material is compared to a layer of the same low k carbon-doped silicon oxide dielectric material of the same thickness formed conventionally over a silicon oxide barrier layer in a single low pressure (below 900 millitorr) deposition, and without etching of the surface of the barrier layer, the composite layer of low k carbon-doped silicon oxide dielectric material formed by the process of the invention will be found to have less occluded gases and other byproducts remaining in the film, with less voids formed in regions of high aspect ratios, apparently due in part to the higher surface mobility of the film during deposition because of the longer residence time resulting from the higher pressure and lower flow rates of the reactants. Furthermore, the composite layer of low k carbon-doped silicon oxide dielectric material will be found to have improved strength due to better adherence of the film to the underlying etched surface of the barrier layer.

Having thus described the invention what is claimed is:

1. An improved process for forming a low k carbon-doped silicon oxide dielectric material on an integrated circuit structure characterized by improved planarity and good gap fill in high aspect ratio regions of said integrated circuits structure which comprises:
    a) depositing a plurality of layers of said low k carbon-doped silicon oxide dielectric material on an integrated circuit structure in a reactor; and
    b) pausing after depositing each layer of said low k carbon-doped silicon oxide dielectric material and before depositing a further layer of said low k carbon-doped silicon oxide dielectric material.

2. The process of claim 1 wherein said depositing step further comprises depositing each of said plurality of layers of low k carbon-doped silicon oxide dielectric material to a thickness not exceeding about 400 nanometers (nm).

3. The process of claim 1 wherein said depositing step further comprises depositing each of said plurality of layers of low k carbon-doped silicon oxide dielectric material to a thickness ranging from about 10 nm to about 400 nm.

4. The process of claim 1 wherein said depositing step further comprises depositing a sufficient number of said plurality of layers of low k carbon-doped silicon oxide dielectric material on said integrated circuit structure to provide a total thickness of said low k carbon-doped silicon oxide dielectric material ranging from about 300 nm to about 1800 nm.

5. The process of claim 1 wherein said depositing step further comprises depositing said low k carbon-doped silicon oxide dielectric material while maintaining a deposition temperature in said reactor ranging from above about 0° C. to below about 30° C.

6. The process of claim 1 wherein said depositing step further comprises depositing said low k carbon-doped silicon oxide dielectric material while maintaining a deposition temperature in said reactor ranging from about 4° C. to about 25° C.

7. The process of claim 1 wherein said depositing step further comprises depositing said low k carbon-doped silicon oxide dielectric material while maintaining a pressure in said reactor ranging from about 300 millitorr to about 1500 millitorr.

8. The process of claim 1 wherein said depositing step further comprises depositing said low k carbon-doped silicon oxide dielectric material while maintaining a pressure in said reactor ranging from about 400 millitorr to about 900 millitorr.

9. The process of claim 1 wherein said depositing step further comprises flowing into said reactor a gaseous source of a mild oxidizing agent and a gaseous source of silicon capable of reacting together to form a film of low k carbon-doped silicon oxide dielectric material which deposits on said integrated circuit structure.

10. The process of claim 1 wherein said step of pausing after depositing a layer of said low k carbon-doped silicon oxide dielectric material and before depositing a further layer of said low k carbon-doped silicon oxide dielectric material is carried out for a period of at least about 10 seconds.

11. The process of claim 10 wherein said step of pausing further comprises maintaining a temperature in said reactor, during said pause step, approximately equal to the deposition temperature.

12. The process of claim 1 wherein said process further comprises the steps of:
    a) forming a base layer of dielectric material over said integrated circuit structure prior to said step of depositing said plurality of layers of said low k carbon-doped silicon oxide dielectric material;
    b) etching an upper surface of said base layer before depositing said plurality of layers of said low k carbon-doped silicon oxide dielectric material; and
    c) then cooling said base layer down to a temperature not more than about 10° C. above the deposition temperature before commencing said deposition temperature.

13. The process of claim 12 wherein said step of etching said upper surface of said base layer is carried out with an oxygen plasma.

14. The process of claim 13 wherein said base layer is cooled down to a temperature not exceeding about 30° C. after said plasma etching step and prior to said deposition step.

15. The process of claim 1 wherein, after said step of depositing said plurality of layers of said carbon-doped silicon oxide dielectric material, said deposited layers of carbon-doped silicon oxide dielectric material are:
  a) subjected to a cure at a temperature of at least about 275° C. for a period of at least about 5 minutes; and
  b) then etching an upper surface of said low k carbon-doped silicon oxide dielectric material to improve adherence of subsequent layers of material to said low k carbon-doped silicon oxide dielectric material.

16. The process of claim 15 wherein said step of etching said upper surface of said low k carbon-doped silicon oxide dielectric material is carried out with an oxygen plasma.

17. An improved process for forming, in a reactor, a low k carbon-doped silicon oxide dielectric material of an integrated circuit structure on a semiconductor substrate, said low k carbon-doped silicon oxide dielectric material characterized by improved planarity and good gap fill in high aspect ratio regions of said integrated circuits structure which comprises:
  a) forming a base layer of dielectric material on said integrated circuit structure;
  b) etching the upper surface of said base layer with an oxygen plasma;
  c) cooling said etched base layer down to a temperature within about 10° C. of the subsequent deposition temperature;
  d) depositing over said etched base layer of dielectric material, to a thickness not exceeding about 400 $\mu$m, a first of a plurality of layers of said low k carbon-doped silicon oxide dielectric material, while maintaining said reactor at a temperature of from about 4° C. to about 15° C., and at a pressure of from about 400 millitorr to about 900 millitorr; and
  e) pausing for from at least 20 seconds to about 90 seconds, after forming each of said layers of low k carbon-doped silicon oxide dielectric material and before depositing a further layer of said low k carbon-doped silicon oxide dielectric material; and
  f) flowing, during said pausing step, a non-reactive gas over said first layer of low k carbon-doped silicon oxide dielectric material at a flow rate equivalent to from about 8 l/m to about 10 l/m in a 0.5 liter reactor.

18. The process of claim 17 which further includes repeating steps d) through f) until the desired total thickness of low k carbon-doped silicon oxide dielectric material is attained.

19. The process of claim 17 wherein said depositing step further comprises flowing into said reactor a gaseous source of a mild oxidizing agent and a gaseous source of silicon capable of reacting together to form a film of low k carbon-doped silicon oxide dielectric material which deposits on said integrated circuit structure.

20. An improved process for forming, in a reactor, a low k carbon-doped silicon oxide dielectric material of an integrated circuit structure on a semiconductor substrate, said low k carbon-doped silicon oxide dielectric material characterized by improved planarity and good gap fill in high aspect ratio regions of said integrated circuits structure which comprises:
  a) forming, on said integrated circuit structure, a base layer of a dielectric material comprising silicon, oxygen, and at least about 7 atomic percent nitrogen;
  b) etching the upper surface of said base layer with an oxygen plasma;
  c) cooling said etched base layer down to a temperature within about 10° C. of the subsequent deposition temperature;
  d) depositing over said etched base layer of dielectric material, to a thickness not exceeding about 400 $\mu$m, a first of a plurality of layers of said low k carbon-doped silicon oxide dielectric material, by flowing into said reactor a gaseous source of peroxide and a gaseous organo-silane, while maintaining said reactor at a temperature of from about 4° C. to about 15° C., and at a pressure of from about 400 millitorr to about 700 millitorr; and
  e) pausing for from at least 20 seconds to about 90 seconds, after forming each of said layers of low k carbon-doped silicon oxide dielectric material and before depositing a further layer of said low k carbon-doped silicon oxide dielectric material; and
  f) flowing over said first layer of low k carbon-doped silicon oxide dielectric material, during said pausing step, a non-reactive gas selected from the group consisting of nitrogen, argon, neon, and helium at a flow rate equivalent to from about 8 l/m to about 10 l/m in a 0.5 liter reactor.

21. An improved process for forming a low k carbon-doped silicon oxide dielectric material on an integrated circuit structure characterized by improved planarity and good gap fill in high aspect ratio regions of said integrated circuits structure which comprises:
  a) depositing a plurality of layers of said low k carbon-doped silicon oxide dielectric material on an integrated circuit structure in a reactor, by flowing a mild oxidizing agent and one or more gaseous sources of silicon into said reactor at flow rates equivalent to flow rates into a 0.5 liter reactor of:
    i) from about 0.5 grams/minute to about 1.8 grams per minute of a 60 vol. % aqueous $H_2O_2$ solution;
    ii) from about 70 standard cubic centimeters per minute (sccm) to about 120 sccm of methylsilane; and
    iii) from 0 to about 40 sccm of silane; while maintaining a pressure in said reactor ranging from about 400 millitorr to about 900 millitorr; and
  b) pausing after depositing each layer of said low k carbon-doped silicon oxide dielectric material and before depositing a further layer of said low k carbon-doped silicon oxide dielectric material.

22. An improved process for forming a low k carbon-doped silicon oxide dielectric material on an integrated circuit structure characterized by improved planarity and good gap fill in high aspect ratio regions of said integrated circuits structure which comprises:
  a) depositing a plurality of layers of said low k carbon-doped silicon oxide dielectric material on an integrated circuit structure in a reactor;
  b) pausing, for a period of at least about 10 seconds, after depositing each layer of said low k carbon-doped silicon oxide dielectric material; and
  c) then flowing a non-reactive gas into said reactor over said previously deposited layer of low k carbon-doped silicon oxide dielectric material at a flow rate equivalent to a flow rate of from about 6 liters/minute (l/m) to about 12 l/m flowing into a 0.5 liter reactor for a period of at least about 15 second before commencing deposition of a further layer of said low k carbon-doped silicon oxide dielectric material.

23. An improved process for forming a low k carbon-doped silicon oxide dielectric material on an integrated circuit structure characterized by improved planarity and good gap fill in high aspect ratio regions of said integrated circuits structure which comprises:

a) forming, over said integrated circuit structure, a base layer of dielectric material containing at least about 7 atomic percent nitrogen therein;

b) then etching an upper surface of said base layer;

c) then depositing a plurality of layers of said low k carbon-doped silicon oxide dielectric material on an integrated circuit structure in a reactor; and d) pausing after depositing each layer of said low k carbon-doped silicon oxide dielectric material and e) cooling said base layer down to a temperature not more than about 10° C. above the deposition temperature before depositing a further layer of said low k carbon-doped silicon oxide dielectric material.

* * * * *